(12) United States Patent
Braswell

(10) Patent No.: US 8,384,575 B1
(45) Date of Patent: Feb. 26, 2013

(54) CONFIGURABLE CONTINUOUS TIME SIGMA DELTA ANALOG-TO-DIGITAL CONVERTER

(75) Inventor: Brandt Braswell, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 13/210,021

(22) Filed: Aug. 15, 2011

(51) Int. Cl.
*H03M 3/00* (2006.01)

(52) U.S. Cl. .................................. 341/143; 341/155

(58) Field of Classification Search ................. 341/143, 341/155, 156, 172, 120
See application file for complete search history.

(56) References Cited

U.S. PATENT DOCUMENTS 7,397,291 B1    7/2008   Parkes, Jr. et al.
7,525,465 B1 *   4/2009   Elwan et al. .................. 341/143

OTHER PUBLICATIONS

Chang, D., et al., "A Continuous-Time Sigma-Delta ADC with Switched-Capacitor-Resistor DAC", Arizona State University, Tempe, Arizona, Department of Electrical Engineering, Final Project of Oversampling ΣΔ Class, Fall 2007.

* cited by examiner

*Primary Examiner* — Joseph Lauture
(74) *Attorney, Agent, or Firm* — Daniel D. Hill

(57) ABSTRACT

An analog-to-digital converter (ADC) includes a continuous time filter, a quantizer, a continuous time digital-to-analog converter, a discrete time DAC, and a switch. The quantizer has an input terminal coupled to the output terminal of the continuous time filter, and a plurality of output terminals. The continuous time DAC has a plurality of input terminals coupled to the plurality of output terminals of the quantizer, and an output terminal. The discrete time DAC has a plurality of input terminals coupled to the plurality of output terminals of the quantizer, and an output terminal. The switch has a first input terminal coupled to the output terminal of the continuous time DAC, a second input terminal coupled to the output terminal of the discrete time DAC, and an output terminal coupled to the input terminal of the continuous time filter.

20 Claims, 1 Drawing Sheet

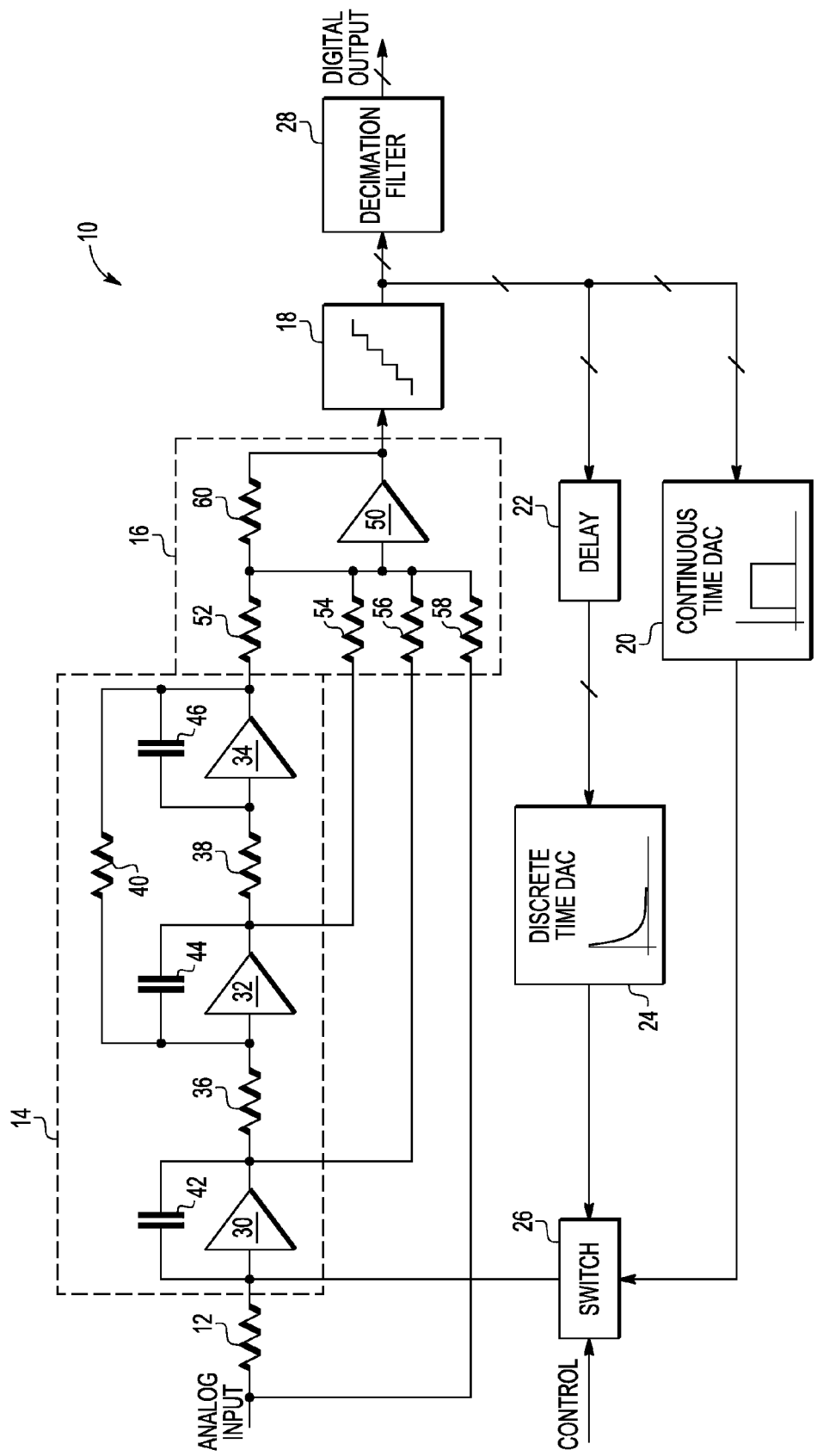

CONFIGURABLE CONTINUOUS TIME SIGMA DELTA ANALOG-TO-DIGITAL CONVERTER

BACKGROUND

1. Field

This disclosure relates generally to analog-to-digital converters, and more specifically, to a configurable continuous time sigma delta analog-to-digital converter.

2. Related Art

Two types of sigma delta analog-to-digital (ADC) converters are continuous time sigma delta ADCs and discrete time sigma delta ADCs. One difference between the two converter types is in the type of feedback digital-to-analog (DAC) signal used. A continuous time sigma delta ADC can use an RC, LC, gm-C, or other continuous time filter, while a discrete time sigma delta ADC can use a switched capacitor filter. An accurate clock is more important for a continuous time sigma delta ADC than it is for a discrete time sigma delta ADC. A continuous time sigma delta ADC is more sensitive to clock jitter. Also, a continuous time sigma delta ADC provides better accuracy, inherent anti-aliasing, and higher operating frequency than a discrete time sigma delta ADC. Sometimes a system needs the performance or power advantage of a continuous time sigma delta ADC and other times it does not.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The FIGURE illustrates, in partial block diagram form and partial schematic diagram form, a configurable continuous time sigma delta ADC.

DETAILED DESCRIPTION

Generally, there is provided, a sigma delta ADC that is configurable to have either a continuous time DAC or a discrete time DAC in a feedback path. The ADC feedback path can be reconfigured with a switch to use either the continuous time DAC or the discrete time DAC depending on the quality of the available clock signal. By selecting between one of the two feedback DACs, a tradeoff can be made between bandwidth, power, or accuracy of the converter.

In one aspect, there is provided, an analog-to-digital converter (ADC) comprising: a continuous time filter having an input terminal and an output terminal; a quantizer having an input terminal coupled to the output terminal of the continuous time filter, and a plurality of output terminals; a continuous time digital-to-analog converter (DAC) having a plurality of input terminals coupled to the plurality of output terminals of the quantizer, and an output terminal; a discrete time DAC having a plurality of input terminals coupled to the plurality of output terminals of the quantizer, and an output terminal; and a switch having a first input terminal coupled to the output terminal of the continuous time DAC, a second input terminal coupled to the output terminal of the discrete time DAC, and an output terminal coupled to the input terminal of the continuous time filter. The continuous time filter may comprise a plurality of integration stages, and wherein the continuous time filter comprises a plurality of feedforward paths, each feedforward path having an input coupled to one integration stage of the plurality of integration stages, and an output. The ADC may further comprise a summing element, the summing element having a plurality of input terminals, an input terminal of the plurality of input terminals coupled to a feedforward path of the plurality of feedforward paths. The continuous time filter may be characterized as being one of an RC (resistance-capacitance) filter, an LC (inductance-capacitance) filter, or a gm-C (conductance-capacitance) filter. The ADC may further comprise a delay element coupled between the plurality of output terminals of the quantizer and the plurality of input terminals of the discrete time DAC. The continuous time DAC may provide a continuous time DAC pulse. The discrete time DAC may be characterized as being a switched capacitor DAC. The ADC may further comprise a decimation filter having a plurality of input terminals coupled to the plurality of output terminals of the quantizer filter, and a plurality of output terminals for providing a digital output. The continuous time filter may be an Nth order integrator, wherein N is an integer greater than or equal to one.

In another aspect, there is provided, an analog-to-digital converter (ADC) comprising: a filter having an input terminal and a plurality of output terminals; a summing circuit having a plurality of input terminals coupled to the plurality of output terminals of the filter, and an output terminal; a quantizer having an input terminal coupled to the output terminal of the summing circuit, and a plurality of output terminals; a continuous time digital-to-analog converter (DAC) having a plurality of input terminals coupled to the plurality of output terminals of the quantizer, and an output terminal; a discrete time DAC having a plurality of input terminals coupled to the plurality of output terminals of the quantizer, and an output terminal; and a switch having a first input terminal coupled to the output terminal of the continuous time DAC, a second input terminal coupled to the output terminal of the discrete time DAC, an output terminal coupled to the input terminal of the continuous time filter, and a control terminal for receiving a control signal. The filter may be an Nth order integrator where N is an integer. The filter may be a continuous time filter, the continuous time filter characterized as being one of an RC (resistance-capacitance) filter, an LC (inductance-capacitance) filter, or a gm-C (conductance-capacitance) filter. The ADC may further comprise a delay element coupled between the plurality of output terminals of the quantizer and the plurality of input terminals of the discrete time DAC. The continuous time DAC may be characterized as being a continuous time return-to-zero DAC. The discrete time DAC may be characterized as being a switched capacitor DAC.

In yet another aspect, there is provided, an analog-to-digital converter (ADC) comprising: a continuous time filter having an input terminal and a plurality of output terminals; a summing circuit having a plurality of input terminals coupled to the plurality of output terminals of the continuous time filter, and an output terminal; a quantizer having an input terminal coupled to the output terminal of the summing circuit, and a plurality of output terminals; a continuous time digital-to-analog converter (DAC) having a plurality of input terminals coupled to the plurality of output terminals of the quantizer, and an output terminal; a discrete time DAC having a plurality of input terminals coupled to the plurality of output terminals of the quantizer, and an output terminal; and a switch having a first input terminal coupled to the output terminal of the continuous time DAC, a second input terminal coupled to the output terminal of the discrete time DAC, and an output terminal coupled to the input terminal of the continuous time filter, the switch being responsive to a control signal. The summing circuit may comprise: a plurality of gain elements, each of the plurality of gain elements having a first input terminal corresponding to an input of the plurality of input terminals of the summing circuit, and the plurality of gain elements each having a second terminal coupled together; and an amplifier having an input terminal coupled to the second terminals of the plurality of gain elements, and an output terminal coupled to the input terminal of quantizer. The continuous time filter may be an Nth order integrator, where N is an integer. The continuous time DAC may be characterized as being a continuous time return-to-zero DAC. The discrete time DAC may be characterized as being a switched capacitor DAC.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The FIGURE illustrates, in partial block diagram form and partial schematic diagram form, configurable continuous time sigma delta ADC 10. Configurable ADC 10 is constructed as part of an integrated circuit using a conventional complementary metal-oxide semiconductor (CMOS) manufacturing process technology with a power supply voltage of about 1.4 volts. In another embodiment, ADC 10 can be made differently and use a different power supply voltage. Configurable ADC 10 includes resistor 12, continuous time filter 14, summing circuit 16, quantizer 18, continuous time DAC 20, delay element 22, discrete time DAC 24, and switch 26. In the illustrated embodiment, continuous time filter 14 is an Nth order integrator, where N is an integer. Continuous time filter 14 includes amplifiers 30, 32, and 34, resistors 36, 38, and 40, and capacitors 42, 44, and 46. Summing circuit 16 includes amplifier 50 and resistors 52, 54, 56, 58, and 60.

Resistor 12 has a first terminal for receiving an analog input signal labeled "ANALOG INPUT", and a second terminal. Filter 14 has an input connected to the second terminal of resistor 12, and first, second, third, and fourth outputs. Summing circuit 16 has a first input connected to the first output of filter 14, a second input connected to the second output of filter 14, a third input connected to the third output of filter 14, and a fourth input connected to the fourth output of filter 14. Quantizer 18 has an input connected to an output of summing circuit 16, and a plurality of output terminals. Delay element 22 has a plurality of input terminals connected to the plurality of output terminals of quantizer 18, and a plurality of output terminals. Discrete time DAC 24 has a plurality of input terminals connected to the plurality of output terminals of delay element 22, and an output terminal. Continuous time DAC 20 has a plurality of input terminals connected to the plurality of output terminals of quantizer 18, and an output terminal for providing a continuous time DAC pulse. Switch 26 has a first input terminal connected to the output terminal of continuous time DAC 20, a second input terminal connected to the output terminal of discrete time DAC 24, and an output terminal connected to the input terminal of continuous time filter 14. Decimation filter 28 has a plurality of input terminals connected to the plurality of output terminals of quantizer 18, and a plurality of output terminals for providing a plurality of output bits labeled "DIGITAL OUTPUT". Note that even though ADC 10 is shown with single-ended input and output terminals, one skilled in the art will know that ADC 10 can be implemented with differential inputs and/or outputs.

Continuous time filter 14 includes a plurality of integration stages. Feedforward paths are provided from between each of the plurality of integration stages. A first feedforward path exists from the first input terminal of resistor 12 to the first terminal of resistor 58. A second feedforward path exists from the first input terminal resistor 36 to the first input terminal of resistor 56. A third feedforward path exists from the first input terminal of resistor 38 to the first input terminal of resistor 54. The number of feedforward paths depends on the number of orders of integration. In another embodiment, the number of feedforward paths and the number of orders of integration can be different. As in another embodiment, continuous time filter 14 may include feedback paths instead of feedforward paths.

In continuous time filter 14, amplifier 30 has an input terminal connected to the second terminal of resistor 12, and an output terminal. Capacitor 42 has a first plate electrode connected to the input terminal of amplifier 30, and a second plate electrode connected to the output terminal of capacitor 42. Resistor 36 has a first terminal connected to the output terminal of amplifier 30, and a second terminal. Amplifier 32 has an input terminal connected to the second terminal of resistor 36, and an output terminal. Capacitor 44 has a first plate electrode connected to the input terminal of amplifier 32, and a second plate electrode connected to the output terminal of amplifier 32. Resistor 38 has a first terminal connected to the output terminal of amplifier 32, and a second terminal. Amplifier 34 has an input terminal connected to the second terminal of resistor 38, and an output terminal. Capacitor 46 has a first plate electrode connected to the input terminal of amplifier 34, and a second plate electrode connected to the output terminal of amplifier 34. Resistor 40 has a first terminal connected to the input terminal of amplifier 32, and a second terminal connected to the output terminal of amplifier 34.

In operation, sigma delta ADC 10 receives analog input signal ANALOG INPUT, and in response, provides a plurality of DIGITAL OUTPUT bits that are representative of analog input signal ANALOG INPUT. The number of output bits can be any number depending, at least in part, on the desired resolution. In one embodiment, the number of output bits is equal to eight. Generally, greater resolution is obtained by increasing the number of bits. Within DAC 10, continuous time filter 14 receives analog input signal ANALOG INPUT and a feedback signal from switch 26. Continuous time filter 14 is implemented as an Nth order integrator, where N is an integer greater than or equal to one. As illustrated, continuous time filter 14 includes three orders of integration. In another embodiment, continuous time filter 14 can have any number of orders or integration. Continuous time filter 14 provides an integrator output plus a plurality of feedforward path outputs to a plurality of inputs of summing circuit 16. Each of the plurality of inputs of summing circuit 16 includes a gain element. In the illustrated embodiment, the gain elements are resistors 52, 54, 56, and 58. In another embodiment, the gain elements may be different. Note that clock signals (not shown) are received and used by each of the blocks illustrated in the FIGURE to control the analog-to-digital conversion process. Quantizer 18 is implemented as a multi-bit ADC.

Quantizer 18 produces a quantized discrete multi-bit output based on the input received from summing circuit 16.

One of the two feedback paths is selected by asserting a control signal labeled "CONTROL" to switch 26. Control signal CONTROL may be user generated. In one embodiment, control signal CONTROL is provided from a random access memory (RAM) associated with a microprocessor (not shown) and comprises a single control bit. In another embodiment, the control signal CONTROL may be generated differently.

One feedback path includes discrete time DAC 24 and a delay element 22. The other feedback path includes continuous time DAC 20. Discrete time DAC 24 is implemented using a switched capacitor M-bit array. The switched capacitor M-bit array has relatively good clock jitter immunity because only the rising edge of the clock signal is used for charge storage and the falling edge of the clock signal is used for charge transfer. A clock signal edge is not used to stop charge transfer. Discrete time DAC 24 may be used when the clock signal has relatively high jitter. Continuous time DAC 20 is implemented in the illustrated embodiment using a continuous time return-to-zero DAC M-bit array. Continuous time DAC 20 requires a higher quality clock signal with relatively lower jitter than can be used with discrete time DAC 24. Delay element 22 is included in some embodiments to ensure correct timing. The type of output signal provided by each of the two feedback DACs is pictorially represented in relevant blocks in the FIGURE.

Decimation filter 28 is a conventional low pass filter and is coupled to the multi-bit output of quantizer 18 and is used to reduce the sampling rate, to remove additional noise, and increase the resolution of the output.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An analog-to-digital converter (ADC) comprising:
   a continuous time filter having an input terminal and an output terminal;
   a quantizer having an input terminal coupled to the output terminal of the continuous time filter, and a multi-bit output;
   a continuous time digital-to-analog converter (DAC) having a multi-bit input coupled to the multi-bit output of the quantizer, and an output terminal;
   a discrete time DAC having a multi-bit input coupled to the multi-bit output of the quantizer, and an output terminal; and
   a switch having a first input terminal coupled to the output terminal of the continuous time DAC, a second input terminal coupled to the output terminal of the discrete time DAC, and an output terminal coupled to the input terminal of the continuous time filter.

2. The ADC of claim 1, wherein the continuous time filter comprises a plurality of integration stages, and wherein the continuous time filter comprises a plurality of feedforward paths, each feedforward path having an input coupled to one integration stage of the plurality of integration stages, and an output.

3. The ADC of claim 2, further comprising a summing element, the summing element having a plurality of input terminals, an input terminal of the plurality of input terminals coupled to a feedforward path of the plurality of feedforward paths.

4. The ADC of claim 1, wherein the continuous time filter is characterized as being one of an RC (resistance-capacitance) filter, an LC (inductance-capacitance) filter, or a gm-C (conductance-capacitance) filter.

5. The ADC of claim 1, further comprising a delay element coupled between the multi-bit output of the quantizer and the plurality of input terminals of the discrete time DAC.

6. The ADC of claim 1, wherein the continuous time DAC provides a continuous time DAC pulse.

7. The ADC of claim 1, wherein the discrete time DAC is characterized as being a switched capacitor DAC.

8. The ADC of claim 1, further comprising a decimation filter having a multi-bit input coupled to the multi-bit output of the quantizer filter, and a multi-bit output for providing a digital output.

9. The ADC of claim 1, wherein the continuous time filter is an Nth order integrator, wherein N is an integer greater than or equal to one.

10. An analog-to-digital converter (ADC) comprising:
    a filter having an input terminal and a plurality of output terminals;
    a summing circuit having a plurality of input terminals coupled to the plurality of output terminals of the filter, and an output terminal;
    a quantizer having an input terminal coupled to the output terminal of the summing circuit, and a multi-bit output;
    a continuous time digital-to-analog converter (DAC) having a multi-bit input coupled to the multi-bit output of the quantizer, and an output terminal;

a discrete time DAC having a multi-bit input coupled to the multi-bit output of the quantizer, and an output terminal; and a switch having a first input terminal coupled to the output terminal of the continuous time DAC, a second input terminal coupled to the output terminal of the discrete time DAC, an output terminal coupled to the input terminal of the continuous time filter, and a control terminal for receiving a control signal.

11. The ADC of claim 10, wherein the filter is an Nth order integrator and N is an integer.

12. The ADC of claim 10, wherein the filter is a continuous time filter, the continuous time filter characterized as being one of an RC (resistance-capacitance) filter, an LC (inductance-capacitance) filter, or a gm-C (conductance-capacitance) filter.

13. The ADC of claim 10, further comprising a delay element coupled between the multi-bit output of the quantizer and the plurality of input terminals of the discrete time DAC.

14. The ADC of claim 10, wherein the continuous time DAC is characterized as being a continuous time return-to-zero DAC.

15. The ADC of claim 10, wherein the discrete time DAC is characterized as being a switched capacitor DAC.

16. An analog-to-digital converter (ADC) comprising:
a continuous time filter having an input terminal and a plurality of output terminals;
a summing circuit having a plurality of input terminals coupled to the plurality of output terminals of the continuous time filter, and an output terminal;
a quantizer having an input terminal coupled to the output terminal of the summing circuit, and a multi-bit output;
a continuous time digital-to-analog converter (DAC) having a multi-bit input coupled to the multi-bit output of the quantizer, and an output terminal;
a discrete time DAC having a multi-bit input coupled to the multi-bit output of the quantizer, and an output terminal; and
a switch having a first input terminal coupled to the output terminal of the continuous time DAC, a second input terminal coupled to the output terminal of the discrete time DAC, and an output terminal coupled to the input terminal of the continuous time filter, the switch being responsive to a control signal.

17. The ADC of claim 16, wherein the summing circuit comprises:
a plurality of gain elements, each of the plurality of gain elements having a first input terminal corresponding to an input of the plurality of input terminals of the summing circuit, and the plurality of gain elements each having a second terminal coupled together; and
an amplifier having an input terminal coupled to the second terminals of the plurality of gain elements, and an output terminal coupled to the input terminal of quantizer.

18. The ADC of claim 16, wherein the continuous time filter is an Nth order integrator, where N is an integer.

19. The ADC of claim 16, wherein the continuous time DAC is characterized as being a continuous time return-to-zero DAC.

20. The ADC of claim 16, wherein the discrete time DAC is characterized as being a switched capacitor DAC.

* * * * *